United States Patent [19]
Bertin et al.

[11] Patent Number: 5,986,962
[45] Date of Patent: Nov. 16, 1999

[54] INTERNAL SHADOW LATCH

[75] Inventors: Claude L Bertin, South Burlington; Kenneth Joseph Goodnow, Essex Junction; Wilbur David pricer, Charlotte; Sebastian Theodore Ventrone, South Burlington, all of Vt.

[73] Assignee: International Business Machines Corporation, Armonk, N.Y.

[21] Appl. No.: 09/121,232

[22] Filed: Jul. 23, 1998

[51] Int. Cl.[6] .................................................. G11C 11/40
[52] U.S. Cl. .......................... 365/228; 365/154; 365/156
[58] Field of Search .................................. 365/154, 156, 365/228

[56] References Cited

U.S. PATENT DOCUMENTS

| | | | |
|---|---|---|---|
| 4,145,761 | 3/1979 | Gunter et al. | 365/227 |
| 4,175,290 | 11/1979 | Harari | 365/156 |
| 4,224,686 | 9/1980 | Aneshansley | 365/154 |
| 4,366,560 | 12/1982 | Mc Dermott et al. | 365/228 |
| 4,396,996 | 8/1983 | Oldham | 365/95 |
| 4,584,669 | 4/1986 | Moynihan et al. | 365/95 |
| 4,594,688 | 6/1986 | Uno | 365/95 |
| 4,858,185 | 8/1989 | Kowshik et al. | 365/181 |
| 5,257,223 | 10/1993 | Dervisoglu | 365/154 |
| 5,300,831 | 4/1994 | Pham et al. | 307/465 |
| 5,410,665 | 4/1995 | Molnar | 395/400 |
| 5,497,115 | 3/1996 | Millar et al. | 327/211 |
| 5,532,958 | 7/1996 | Jiang et al. | 365/156 |
| 5,561,621 | 10/1996 | Devin et al. | 365/156 |
| 5,629,643 | 5/1997 | Moughanni et al. | 327/199 |
| 5,668,770 | 9/1997 | Itoh et al. | 365/227 |
| 5,682,345 | 10/1997 | Roohparvar et al. | 365/185.04 |
| 5,682,351 | 10/1997 | Han | 365/189.05 |

OTHER PUBLICATIONS

Shigematsu, S. et al., "A 1–V High Speed MTCMOS Circuit Scheme for Power–Down Applications", *1995 Symposium on VSLI Circuits Digest of technical Papers*, Jun. 8–10, 1995, pp. 125–126.

Akamatsu, H. et al., "A Low Power data Holding Circuit with an Intermittent Power Supply Scheme for Sub–IV MT–CMOS LSIs", *1996 Symposium on VLSI Circuits Digest of Technical Papers*, 1995, pp.14–15.

*Primary Examiner*—Vu A. Le
*Attorney, Agent, or Firm*—Pollock, Vande Sande & Amernick; Eugene I. Shkurko

[57] ABSTRACT

An integrated circuit implements simple and efficient normal power to low power and low power to normal power transitions. Dedicated shadow latch circuits are added, each having a corresponding system latch. The state of the system latches is transferred to the shadow latches upon a transition from normal to low power mode and the stored information is transferred back to the system latches on the transition from low power to normal power operation. The shadow latches are optimized to minimize power usage during low power operation.

18 Claims, 6 Drawing Sheets

INTERNAL SHADOW LATCH

TECHNICAL FIELD

The invention relates to an improved architecture for integrated circuits.

BACKGROUND OF INVENTION

Volatile circuits have been and are the norm in digital technology. In order to maintain information, continuous power is necessary. Accordingly, in order to minimize the power consumed when there is no user activity, digital technologies, including custom and ASIC, applications typically feature some form of standby, sleep or low power mode in contrast to the normal or run mode. The standby or sleep mode exhibits greatly reduced power dissipation. Standby mode or sleep mode may be defined by interruption of the system clock or by disconnecting the power supply or by both. Power is most effectively minimized when all, or almost all, of the logic on a chip can be disconnected from the power supply. Modern logic technologies tend to be optimized for performance, and as a result the "off" currents of logic transistors can be substantial. This, of course, minimizes the advantages which might be gained from any sleep or standby mode in which power remains continuously applied.

Recovery from the standby mode in which power is interrupted usually requires returning the chip to the state it was in just prior to entering the standby mode. Typically this requires saving the state of the latches. In some systems, there may be provision for an elaborate powerdown sequence in which the content of latches and registers can be stored on a hard disk. Simple applications, on the other hand, cannot justify a hard disk for these features. In addition, the complexity of the power-down sequence may be undesirable. The present invention is directed at providing a simple and inexpensive solution which implements a power-down standby mode in an efficient and effective manner The simplicity and efficiency of the invention recommend it for use on devices as simple as a pocket calculator, as well as in more complex devices.

SUMMARY OF INVENTION

As will be described, in order to be able to return from the standby mode, the information state of latches and registers (collectively referred to as latches) is stored in dedicated circuits, each of which will be termed a shadow latch. Having saved the system status, it is now possible not merely to run the system at low power, but to actually turn the system power off (except of course for the shadow latches), i.e. zero power. As the name implies, the shadow latch is integrated either within or in close proximity to the circuit from which information to be stored in the shadow latch will be obtained. For convenience, the source of the information will be referred to herein as a system latch or simply a latch. In accordance with the invention, the components of the shadow latch are fabricated with the same technology as are the other or system components. However, the transistors or other components of the shadow latches have certain additional properties which specifically minimize leakage paths and which may not be present in the system latches. In accordance with the invention, the components of the shadow latch may feature any one or more or all of the following:

A. Longer than minimum channel length: to prevent short channel current effects;

B. Closed structures: to minimize sub-threshold currents and parasitic edge effect transistors;

C. Ion implanted raised thresholds: to minimize normal sub-threshold current;

D. Minimum sized transistors (except for the drivers which may be fabricated with the same characteristics as transistors in the system latch);

E. Resistive coupling from drain to gate: for soft error immunity.

Various embodiments with these features will be described. In some embodiments, each shadow latch and its corresponding system latch will maintain a one-for-one correspondence as the system latch changes state during the normal power mode of operation. As will be described at this point, however, that is not essential to the invention.

During the run or normal mode, the shadow latch need not directly mirror the state changes of the system latch. Millions of cycles can be executed in the normal power or run mode without a transition to a power-down or standby mode. During this time, the shadow latch can be functionally disconnected, effectively eliminating its AC power requirements. However, given a cycle that the system is about to enter a low power or standby power mode, a shadow data port is enabled. There are at least two indicators that may be used to indicate that the system is about to enter a low power or standby mode. A first is a particular op code. This indicator may be taken advantage of by providing a detector for this op code. Alternatively, the logic status of a particular pin (on or off), such as a low power interrupt pin, can also be used by detecting the state of the pin. On detection of either indicator, the shadow latch is enabled (and required) to copy or mimic its corresponding system latch. Once the shadow latch has achieved the condition in which it mirrors the state of its corresponding system latch, then the power-down or standby mode can be entered. In some technologies, the shadow latch may require an extended amount of time to make a transition from the off state to the state in which it mimics its system latch. In those technologies, the system may be put into a stall (for one or more cycles) to allow the shadow latch to properly be set to the current state for the system latch.

On restart, for similar reasons, another stall and/or delay may be implemented to allow the system to copy the state of the shadow latch. Upon restoration, i.e. when the system achieves the state of its corresponding shadow latch, the stall is lifted and the shadow latch may be de-powered.

Accordingly, the invention provides apparatus including a latch; and a shadow latch; the shadow latch comprising:
first means coupled to the latch for storing a datum held in the latch just prior to a transition to a low power mode; and
second means for automatically restoring, in the latch, the datum stored by the first means, upon the latch resuming a normal power mode.

The invention also comprises an integrated circuit including a plurality of latch circuits, a plurality of shadow latch circuits, each of the shadow latch circuits related to one of the plurality of latch circuits;

each of the shadow latch circuits comprising:
first means coupled to the related latch circuit for storing a datum held in the related latch circuit just prior to a transition to a low power mode; and
second means for automatically restoring, in the related latch circuit, the datum stored by the first means, upon the related latch circuit resuming a normal power mode.

BRIEF DESCRIPTION OF THE DRAWINGS

The present application will now describe several embodiments of the invention in the following portions of this specification when taken in conjunction with the attached drawings in which like reference characters identify identical apparatus and in which.

BEST AND VARIOUS MODES FOR CARRYING OUT INVENTION

Those skilled in the art will understand that the present invention is applicable to the design and fabrication of integrated circuits. An integrated circuit will typically include many, i.e. 100s, 100s, or even more, circuits interconnected on a single chip. Many integrated circuits operate in a normal mode as well as in a low power or standby mode. It is advantageous to achieve two related functions:

1. Minimize the power usage during the standby or low power mode; and
2. Automatically save the "state" of the circuits on the chip just prior to entering the standby or low power state and then automatically restore the state of the chip when making a transition from the low power or standby state to the normal power mode of operation.

To fulfill these functions, circuits are added to the group of circuits on the chip which are dedicated to perform the second function. Thus, to the extent that there are many operating circuits on the chip whose state is important in the transition from normal power to standby and back again, there must be an equal number of dedicated circuits which have the purpose of retaining the state and then restoring the state of the chip during the transition. The circuits on the chip whose state is being retained and which are inoperable in the low power or standby mode are referred to herein for convenience as system circuits or system latches. The circuits which have been added for the purpose of retaining the state of the system circuits or system latches in the standby or low power mode are referred to as shadow circuits or shadow latches. In order to implement the invention, then, the chip fabricator needs direction with respect to the circuitry of the shadow latch and the coupling arrangement for coupling a given system latch with its related shadow latch.

Figures 1A, 1B:
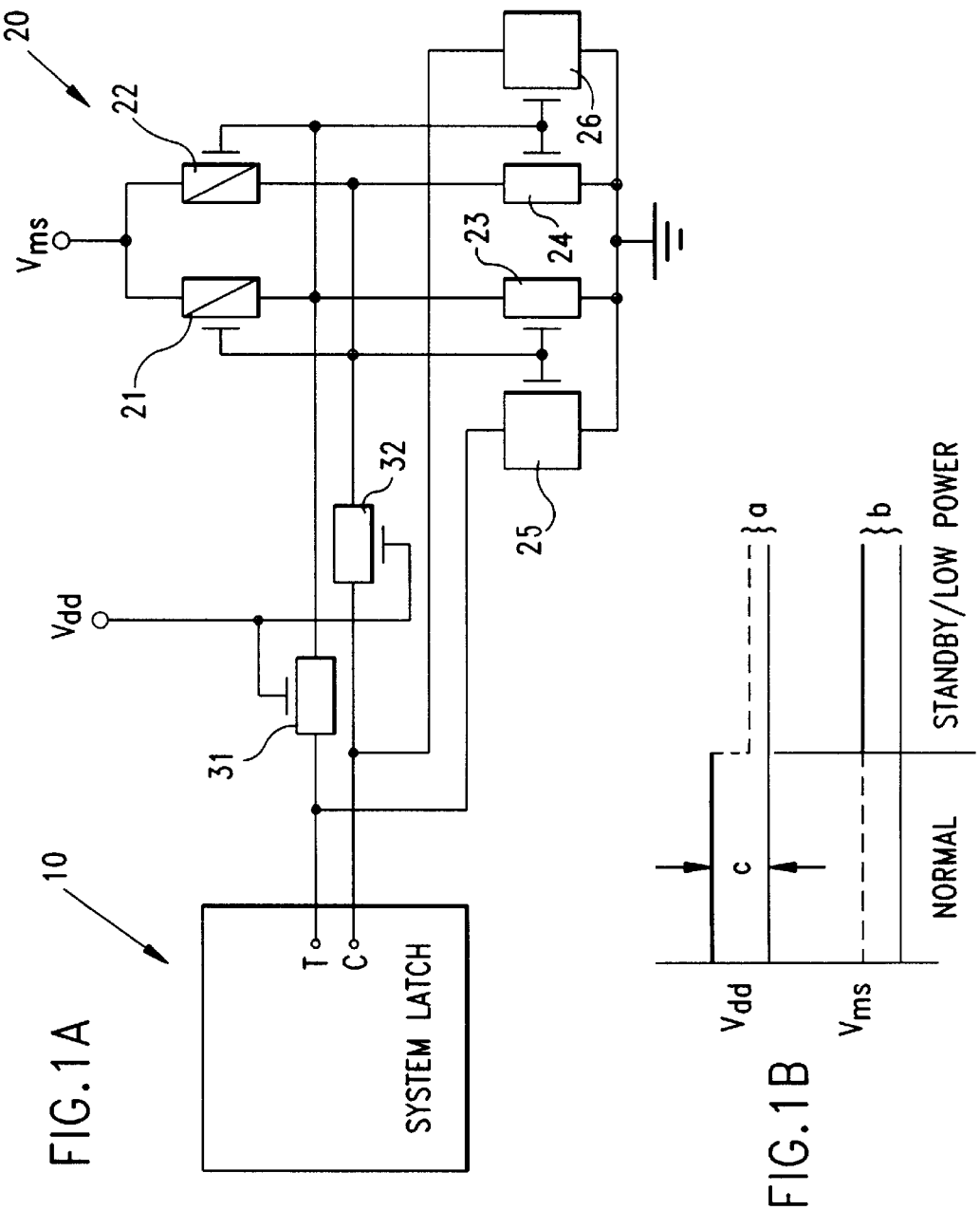
FIG. 1A illustrates a portion of a typical integrated circuit in accordance with the invention and particularly illustrates a system latch or system latch circuit and its related shadow latch or shadow latch circuit.
FIG. 1B illustrates waveforms for the supply voltages $V_{dd}$ and $V_{ms}$ in both the normal and standby or low power mode of operation.

FIG. 1A is a schematic illustrating the features just enumerated. In particular, FIG. 1A shows a system latch 10 coupled to a shadow latch 20 via the coupling circuitry illustrated between the latches 10 and 20. The system latch is not represented in detail in FIG. 1A except to illustrate its external terminals T and C. This emphasizes the generality of the invention in that it is applicable regardless of the circuit design of a system latch or latches. The shadow latch 20 comprises four transistors and two driver transistors. As seen in FIG. 1A, these are two pairs of cross-connected transistors 21–22 and 23–24; the pairs of the cross-connected transistors are connected to drivers 25 and 26.

Transistors 31 and 32 are used to direct couple the system latch 10 and the shadow latch 20 so that the shadow latch 20 can mimic or follow the state of the system latch 10 during some or all of the normal power mode operation. The coupling is effected by the transistors 31, 32 powered from $V_{dd}$. $V_{dd}$ is the source of system power, i.e. it is the power source for the system latch 10.

FIG. 1B illustrates the power modes. System power, $V_{dd}$, is normally maintained at a level ("C") sufficient to provide normal operation for the integrated circuit including the system latches 10 and the coupling transistors 31, 32. The power for the shadow latches $V_{ms}$ (for maintenance state) may be applied continuously to the shadow latch 20, i.e. there is no transition in $V_{ms}$ during the transition from normal to standby or low power mode. As shown in FIG. 1B, however, the normal system power $V_{dd}$ is reduced in the standby or low power mode to zero or to a point where it is inadequate to provide normal operation for system elements such as the system latch 10 and the coupling transistors 31, 32. Thus, the pass transistors 31, 32 have the function of providing close coupling between the system latch 10 and its related shadow latch 20 during normal operation but decouple the circuits in the standby or low power mode of operation. As will be described below, in other embodiments, $V_{ms}$ (the power for the shadow latches) need not be used during most of the time the system is operating in normal power mode.

The shadow latch 20 includes four relatively narrow transistors, 21–24, and two moderately wider transistors, 25, 26, the latter of which are the drivers for a system latch. Note that while the transistors 31, 32 decouple the shadow latch 20 from the system latch 10, the drivers 25, 26 remain connected to the system latch. This fact and design of the drivers 25, 26 ensure that when the system returns to full power or normal power operation, the system latch will come up in the state dictated by the state of the drivers 25, 26 which will reflect the state of the shadow latch 20. When fully powered, the shadow latch drivers 25, 26 are quite inadequate to resist changes in the system latch 10.

It is within the scope of the invention to provide some controlled resistance with a known RC time constant in the cross-coupled arms of the shadow latch 20. This is to prevent incidents of alpha particle or other atomic events from inducing soft errors during a power-down. This resistance can be provided by undoped or lightly doped polysilicon.

While the drivers 25, 26 remain directly connected at all times to the high leakage transistors of the system latches, the driver devices 25, 26 do not participate in any high leakage paths. This is a consequence of the fact that in the standby mode, all nodes of the system latch return to ground and not to $V_{dd}$.

Note that while the embodiment of FIG. 1A illustrates N channel devices, a dual of the schematic of FIG. 1A can also be used with P channel pass devices, P channel drivers and system power being interrupted from ground rather than $V_{dd}$.

Figure 2:
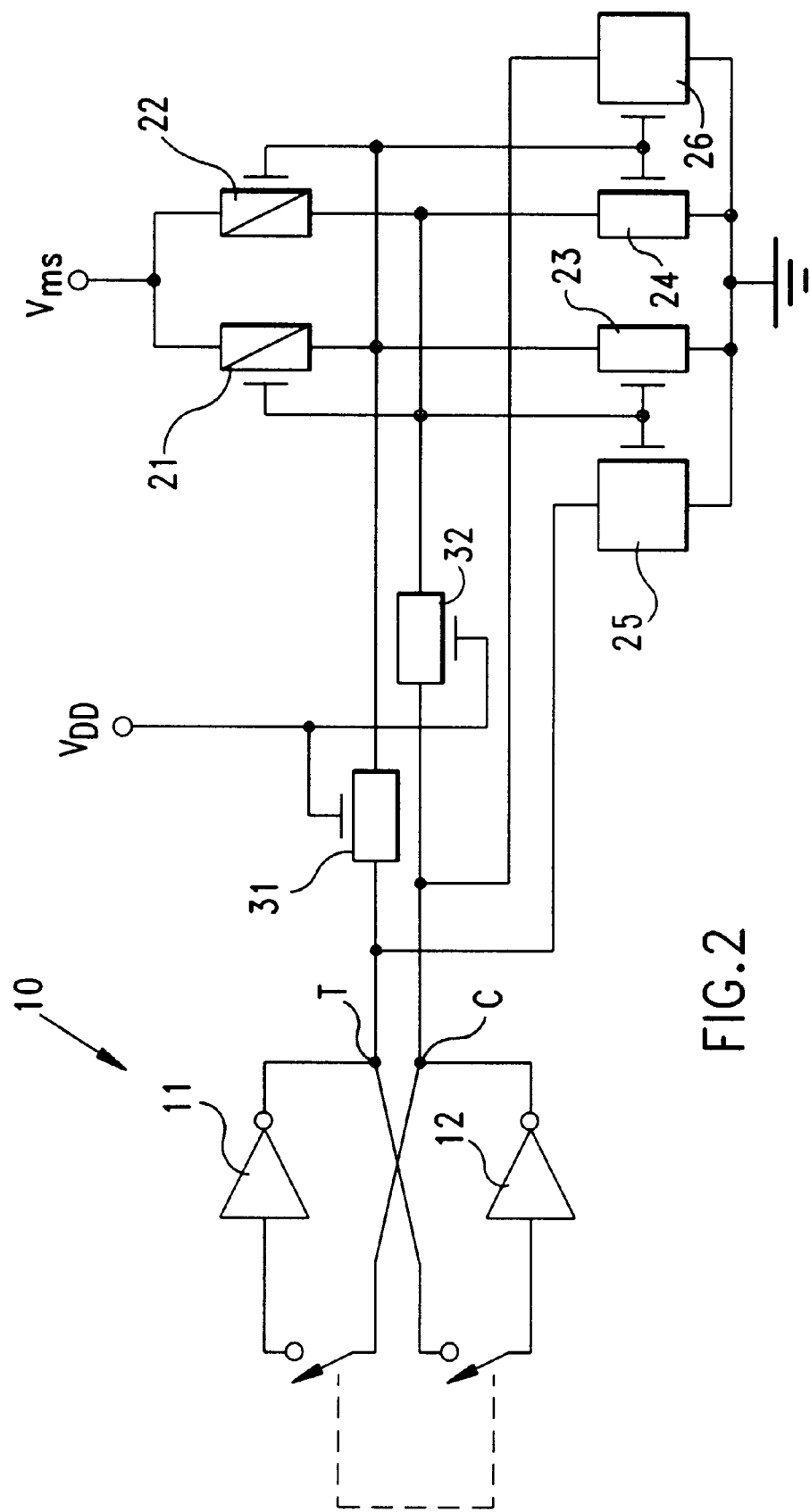
FIG. 2 is similar to FIG. 1A except that it shows the circuit diagram for one form of system latch or latch circuit.

FIG. 2 is in all respects similar to FIG. 1A except that the circuit of the system latch 10 is shown as a circuit which becomes open in the feedback loop during the re-powering. If this feature is employed in the system latches, the drivers 25, 26 can be reduced in comparison in size as a consequence.

Figure 3:
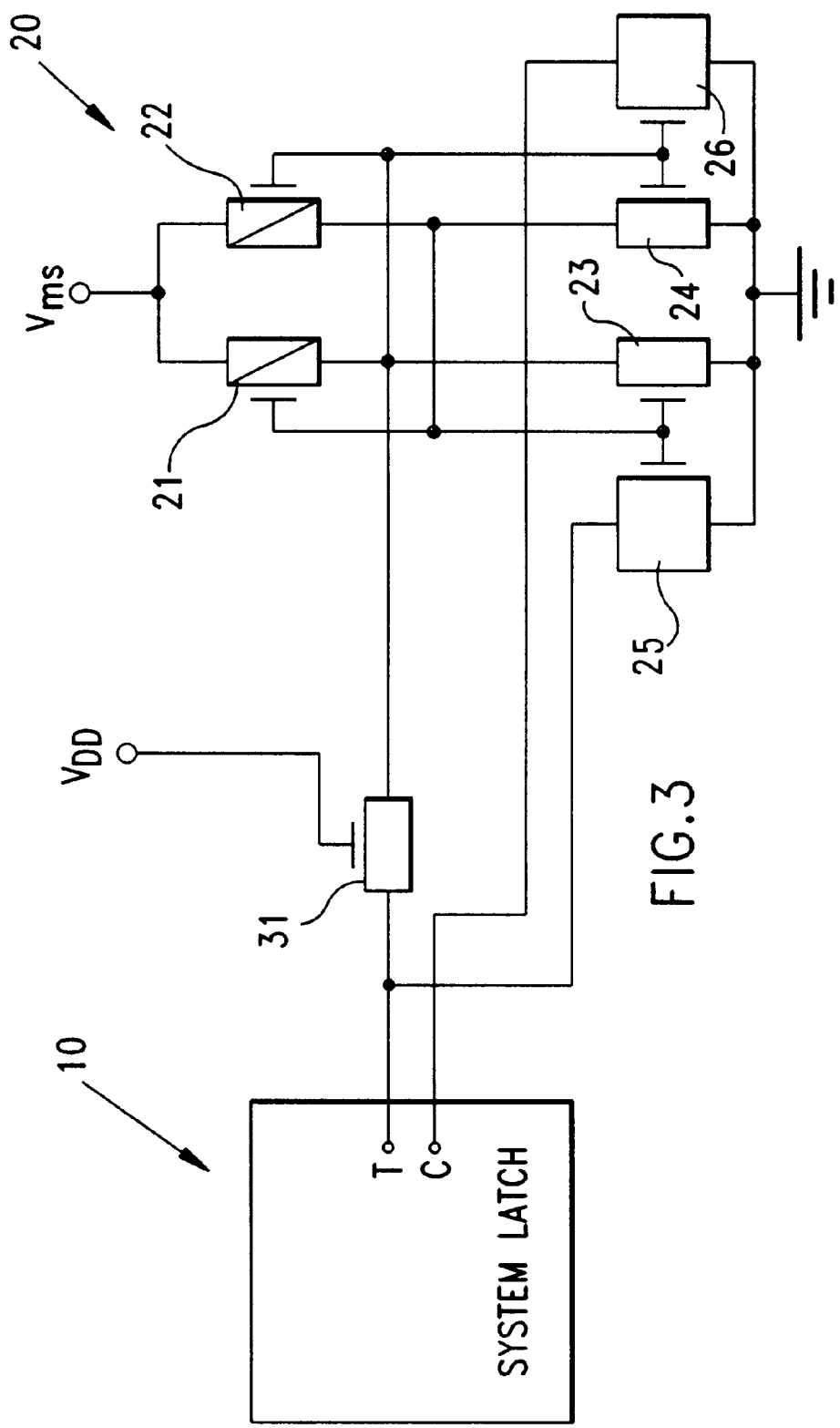
FIG. 3 is a modification of FIG. 1A illustrating a different coupling arrangement between the system latch or latch circuit and the shadow latch or shadow latch circuit.

FIG. 3 differs from FIG. 1A in using only a single pass device 31. In all other respects, the circuit of FIG. 3 is identical to that shown in FIG. 1A.

Figure 4:
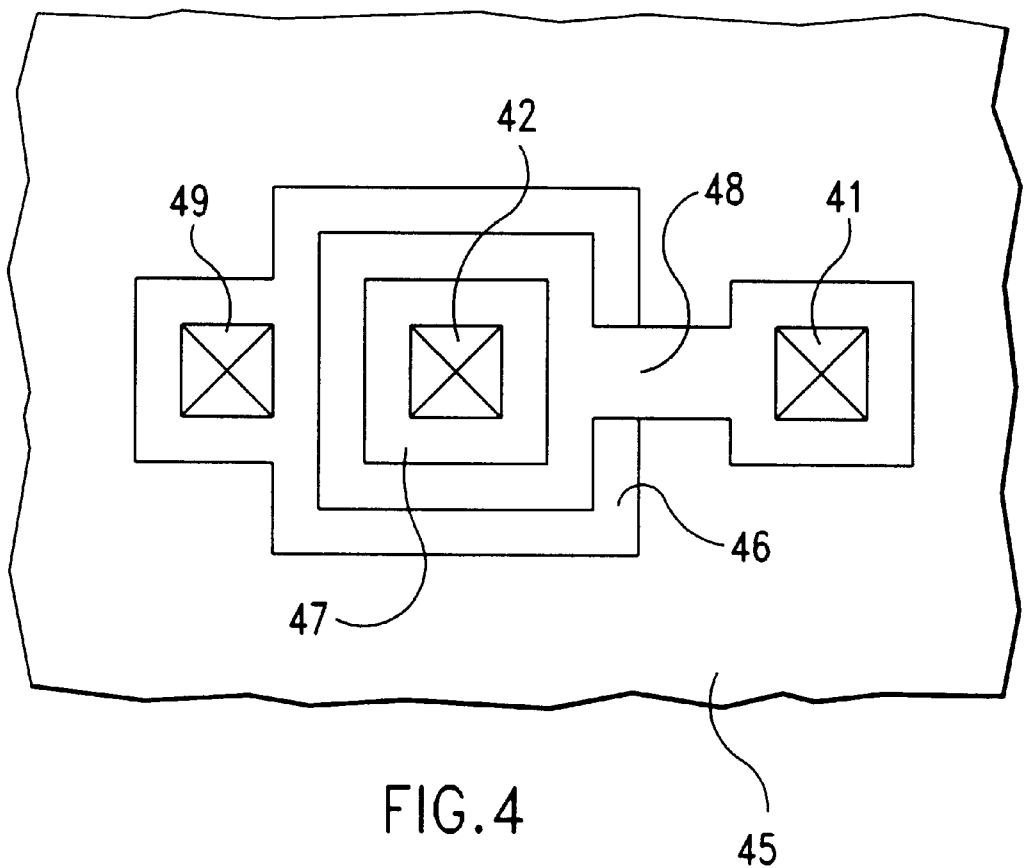
FIG. 4 is a plan view of an implementation of a typical shadow latch in accordance with the invention.

FIG. 4 is a plan view of a preferred closed structure FET device for use within the shadow latch. As shown in FIG. 4, the FET device employs a closed structure which is preferred for its relative immunity to parasitic edge effect transistors. In FIG. 4, the device isolation 45 surrounds the device itself. The device has contacts 41, 42 and 49 as well as source 46, drain 47 and gate 48.

The closed structure FET device of FIG. 4 typically will also have one or more of the following features:

A. Longer than minimum channel length to prevent short circuit current effects (here the longer than minimum channel length is relative to system devices);

B. Ion implanted raised thresholds to minimize normal sub-threshold currents;

C. Minimum size transistors (aside from the drivers 25, 26); or

D. Finally, those FETs, when connected into a shadow latch, may feature resistive coupling (not shown) from drain 47 of one FET to gate 48 of another FET for soft error immunity.

Figure 5:
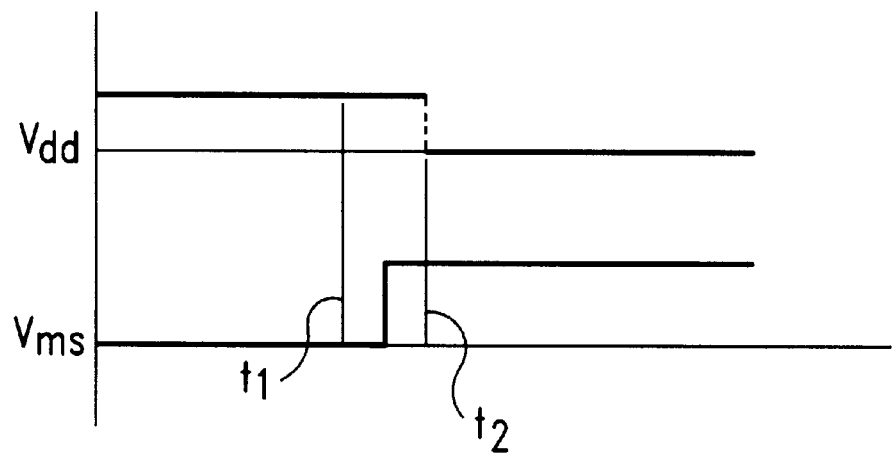
FIG. 5 is a variant of FIG. 1B illustrating different power waveforms for embodiments wherein the shadow latch can be disabled or de-powered during the normal or run mode of operation and only energized to mimic its related latch just prior to a transition of the system to a low power or sleep mode.

The embodiments described so far maintain power to the shadow latch circuits 20 at all times so that during normal system operation the shadow latch circuits 20 follow the status of the related system latch 10. This of course requires that the shadow latch 20 be capable of responding at a rate fast enough to follow its related latch 10 at the maximum speed of the related latch 10. The embodiments to be described in connection with FIGS. 5 and 6 differ, in that to a large extent during normal, or run mode operation the shadow latches 20 are, or may be de-powered. It is still necessary to ensure that the shadow latch 20 assumes the state of the related system latch 10 prior to the time the system enters a low power or standby mode. FIG. 5 illustrates the power supplied to the system ($V_{dd}$) and the power ($V_{ms}$) applied to the shadow latches. As indicated in FIG. 5, system power is at normal or run mode until time $t_2$ at which time system power may be disabled or at least reduced below the level required for run or normal mode operation. Thus, at time $t_2$ the system enters the sleep or standby mode. FIG. 5 differs from FIG. 1B in that for a large part of the time prior to $t=t_2$, the shadow latches 20 are de-powered, i.e. $V_{ms}$ is disabled. As just indicated, it is essential for the shadow latches 20 to achieve the status of the related system latch 10 prior to the time the system goes into the sleep or standby mode ($t_2$). To this end, at a time $t=t_1$ (before $t=t_2$) the shadow subsystem detects impending power down of the system. As a consequence, at $t=t_1$ the shadow latch power source $V_{ms}$ is energized such that at some later time, but before $t=t_2$, the shadow latch power system is enabled. The delay, that is the time between $t_1$ and $t_2$, is designed to provides sufficient time to bring the shadow latch power system up and for the shadow latch 20 to assume the status of the corresponding system latch 10.

Trade offs can be implemented. If the shadow latch 20 is designed to be as fast as the corresponding system latch 10, then this delay between $t_1$ and $t_2$ is minimized. On the other hand, since there is only one delay per transition, there may be advantages in designing the shadow latches 20 to be "slower" than the system latches 10. This can be accommodated so long as the delay, that is $t_2-t_1$, is long enough so that the shadow latch 20 can achieve the status of the system latch 10 before the system is de-powered.

Figure 6:
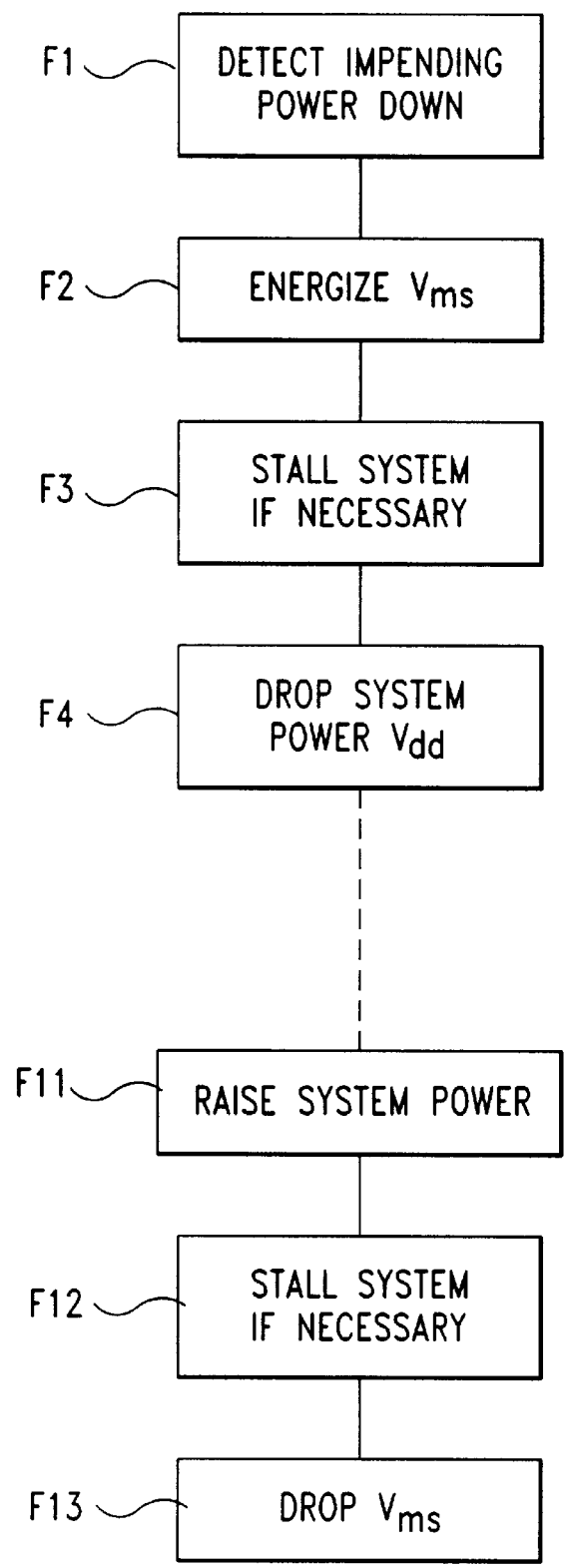
FIG. 6 illustrates the added functions required of logic in order to implement the power waveforms of FIG. 5.

FIG. 6 thus illustrates the functions (F1–F4) which are performed as the system makes the transition from normal or run mode to sleep or low power mode and other functions (F11–F13) which are performed as the system undergoes the complementary transition from low power or sleep mode to normal or run mode.

More particularly, the transition state is initiated at function F1 when impending power-down is detected. How the condition of impending power-down is detected will be discussed below. However, once the impending power-down is detected, the next function F2 is triggered to energize the shadow latch supply ($V_{ms}$). Once the shadow latch supply ($V_{ms}$) energization is initiated, function F3 may be performed if necessary. Function F3 stalls the system, preventing logic transitions for a delay, to ensure that the shadow latches 20 are both energized and achieve the status of the related system latch 10. Whether the stall is necessary, and if necessary its extent, depends on the time required for the shadow latch power to come up and the time required for the shadow latches to achieve the status of the related system latch. Thus, if a stall is implemented, at the conclusion of the stall or if the stall is not necessary, immediately after function F2, function F4 is performed to drop the system power $V_{dd}$ to its low power or standby mode. This completes the transition from normal or run power to sleep or standby mode.

At such later time as there is reason to initiate a transition from the standby or low power mode to normal or run power mode, function F11 is performed to raise the system power $V_{dd}$. Depending on the time required to raise the system power $V_{dd}$ and the design of the shadow latch drivers, function F12 may or may not be necessary, and if necessary, its duration will be determined. Function F12 stalls the system for a period long enough to ensure that the system latches achieve the status of the corresponding shadow latch. Once that condition is achieved, function F13 is implemented to drop a supply $V_{ms}$ to the shadow latch subsystem.

Those skilled in the art will understand that the schematics of FIG. 1A and 2–4 may apply to embodiments in which the shadow latch subsystem is de-powered except when necessary. As has been described, however, some of the parameters of the shadow latch devices may be selected dependent upon whether the shadow latch subsystem is continuously energized or only intermittently energized.

A transition from normal or run mode to a low power mode can be detected in several ways. In some systems, a discrete op code may be decoded to initiate a transition to a low power mode of operation. A detector then can be used to signal the, presence of the op code in the instruction stream. Alternatively, the logic state of a particular pin, such as a low power interrupt pin is detected to signal a transition to a standby or low power mode of operation.

Figure 7:
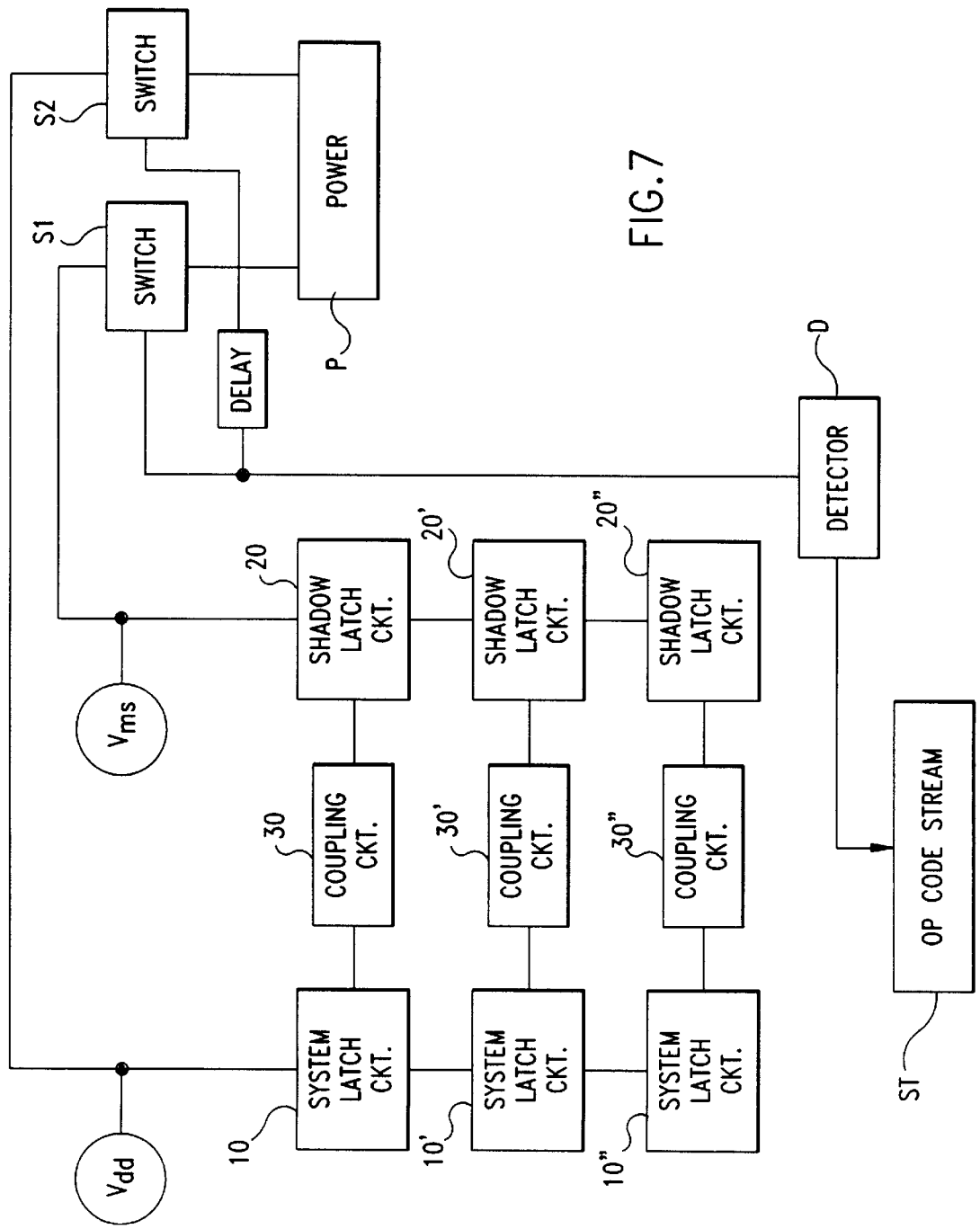
FIG. 7 is a block diagram showing how an op code detector can be used to control the power applied to the system and shadow latch circuits, respectively.

An instance of the foregoing is shown in FIG. 7. FIG. 7 shows a plurality of system latches 10, 10' and 10" coupled to related shadow latch circuits 20, 20' and 20" by dedicated coupling circuits 30, 30' and 30". The system or latch circuits are powered from $V_{dd}$ whereas the shadow latch circuitry is powered from the supply $V_{ms}$. Both supplies originate at a source of power P coupled respectively through switches S1 (for $V_{ms}$) and S2 (for $V_{dd}$). A detector D is illustrated monitoring an op code stream ST. When the detector D detects an op code calling for low power or standby mode, it energizes its output which has two effects. One effect is to enable switch S1 to provide power from the terminal $V_{ms}$, Similarly, after the delay indicated between the detector D and the switch S2, the switch S2 is enabled so as to disable the supply from $V_{dd}$. This ensures that the shadow latches 20, 20' and 20" are enabled and can mimic their related latches by the time the latches are de-powered.

It should be apparent to those skilled in the art that rather than detecting an op code, the detector D could monitor the logic level on a particular pin such as a low power interrupt pin, for the same effect.

While several embodiments of the invention have been described in detail, those examples should not be considered limiting but the scope of the invention should be construed in accordance with the claims attached hereto.

What is claimed is:

1. An integrated circuit comprising:
   a plurality of latch circuits;
   a plurality of shadow latch circuits, each of the shadow latch circuits related to one of the plurality of latch circuits;
   each of said shadow latch circuits comprising:
      first means coupled to the related latch circuit for storing a datum held in the related latch circuit just prior to a transition from a normal power mode to a low power mode; and
      second means for automatically restoring, in the related latch circuit, the datum stored by the first means, upon the related latch circuit resuming a normal power mode.

2. The circuit of claim 1 in which said first means includes a coupling circuit to repetitively provide the shadow latch with the state of the related latch circuit.

3. The circuit of claim 2 in which the coupling circuit ensures that the shadow latch continuously mimics the state of the related latch circuit.

4. The circuit of claim 1 which further includes a power supply and means coupling the shadow latch circuits to the power supply to maintain power to the shadow latches during low power modes of the system.

5. The circuit of claim 1 wherein the first means includes active devices with channel lengths exceeding a minimum channel length.

6. The circuit of claim 1 wherein the first means includes active devices with closed structures.

7. The circuit of claim 1 wherein the first means includes active devices with ion implanted raised thresholds.

8. The circuit of claim 1 wherein the first means includes active devices with minimum size.

9. The circuit of claim 1 wherein the first means includes active devices with resistive coupling from drain to gate.

10. The circuit of claim 1 wherein the latch and shadow latch circuits each comprise a common technology.

11. The circuit of claim 2 wherein the coupling circuit is limited to a single active device between a latch circuit and a related shadow latch circuit.

12. The circuit of claim 2 wherein the coupling circuit is limited to a pair of active devices between a latch circuit and a related shadow latch circuit.

13. The circuit of claim 1 which includes detecting means for detecting an impending transition from a normal power mode to a low power mode.

14. The circuit of claim 13 where the detecting means responds to system operation codes.

15. The circuit of claim 13 where the detecting means responds to a particular logic state of a specific pin.

16. The circuit of claim 13 in which said detecting means enables a power supply for said shadow latch circuits.

17. A method of operating an integrated circuit having system latches for performing useful operations and shadow latches for retaining system latch states during inoperative periods of the system latches, where there is a pairing of system and shadow latches, said method including:
   operating said system latches during a period of normal power operation and de-powering said system latches during other times,
   insuring that the operating state of each system latch, just prior to the de-powering, is reflected in the state of a paired shadow latch prior to the de-powering, and
   transferring the state of a shadow latch to the paired system latch on re-powering the system latches.

18. The method of claim 17 which also includes:
   de-powering said shadow latches after re-powering the system latches and re-powering the shadow latches in response to an impending transition of the system latches to a depowered state.

* * * * *